(12) United States Patent
Momose et al.

(10) Patent No.: US 9,226,421 B2
(45) Date of Patent: Dec. 29, 2015

(54) ELECTRO-OPTICAL DEVICE WITH REINFORCING STRUCTURE AND ELECTRONIC APPARATUS HAVING THE ELECTRO-OPTICAL DEVICE

(71) Applicant: SEIKO EPSON CORPORATION, Tokyo (JP)

(72) Inventors: Yoichi Momose, Matsumoto (JP); Nobutaka Urano, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 313 days.

(21) Appl. No.: 13/929,126

(22) Filed: Jun. 27, 2013

(65) Prior Publication Data
US 2014/0022754 A1    Jan. 23, 2014

(30) Foreign Application Priority Data
Jul. 17, 2012 (JP) ................. 2012-158356

(51) Int. Cl.
*G02F 1/1333* (2006.01)
*H05K 7/02* (2006.01)

(52) U.S. Cl.
CPC ............ *H05K 7/02* (2013.01); *G02F 1/133308* (2013.01); *G02F 2001/133314* (2013.01); *G02F 2001/133322* (2013.01)

(58) Field of Classification Search
CPC ............... H05K 7/02; G02F 1/133308; G02F 2001/133314; G02F 2001/133322
USPC ........................... 362/97.2; 349/58
See application file for complete search history.

(56) References Cited

U.S. PATENT DOCUMENTS

| | | | |
|---|---|---|---|
| 8,044,586 B2 * | 10/2011 | Wang et al. ................ 313/512 |
| 8,491,066 B2 * | 7/2013 | Chang .................... 312/223.2 |
| 8,648,978 B2 * | 2/2014 | Sato et al. ................... 349/58 |
| 2001/0035931 A1 * | 11/2001 | Kumagai et al. ............. 349/153 |
| 2008/0123352 A1 | 5/2008 | Maeda et al. |
| 2009/0244433 A1 * | 10/2009 | Ota ............................ 349/58 |
| 2011/0294000 A1 * | 12/2011 | Kim et al. ................... 429/176 |
| 2013/0070166 A1 * | 3/2013 | Kuroda ...................... 348/739 |
| 2013/0088820 A1 * | 4/2013 | Kuroda .................. 361/679.01 |
| 2013/0128546 A1 * | 5/2013 | Kuo et al. .................. 362/97.1 |

(Continued)

FOREIGN PATENT DOCUMENTS

| JP | A-2003-015530 | 1/2003 |
|---|---|---|
| JP | A-2009-037744 | 2/2009 |
| JP | A-2009-224207 | 10/2009 |

(Continued)

OTHER PUBLICATIONS

CalRecycle/California Department of Resources, Plastics Information and Resources: Plastic Resins, Jun. 15, 2011.*

*Primary Examiner* — Hoa C Nguyen
*Assistant Examiner* — Keith Depew
(74) *Attorney, Agent, or Firm* — Oliff PLC

(57) ABSTRACT

In an electro-optical device, a backup plate is disposed to overlap an electro-optical panel, and the backup plate includes a groove portion (reinforcing groove) recessed from the front face and protruding on the back face. In addition, the backup plate includes a groove reinforcement region including the reinforcing member extending through inside of the groove portion. Accordingly, the backup plate is resistant to deflection, and therefore deflection of the electro-optical panel can be effectively suppressed.

11 Claims, 10 Drawing Sheets

(56) References Cited

U.S. PATENT DOCUMENTS

2014/0139779 A1* 5/2014 Wu .................................. 349/58
2014/0240606 A1* 8/2014 Tomomasa et al. ........... 348/725

FOREIGN PATENT DOCUMENTS

JP      A-2009-251566     10/2009
WO    WO 2005/068899 A1    7/2005

* cited by examiner

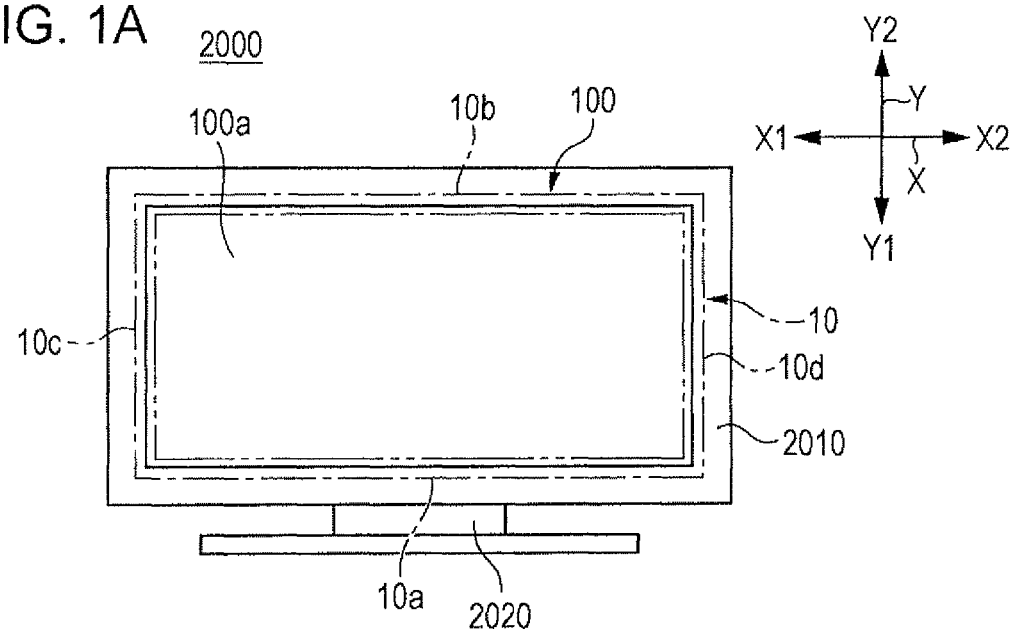
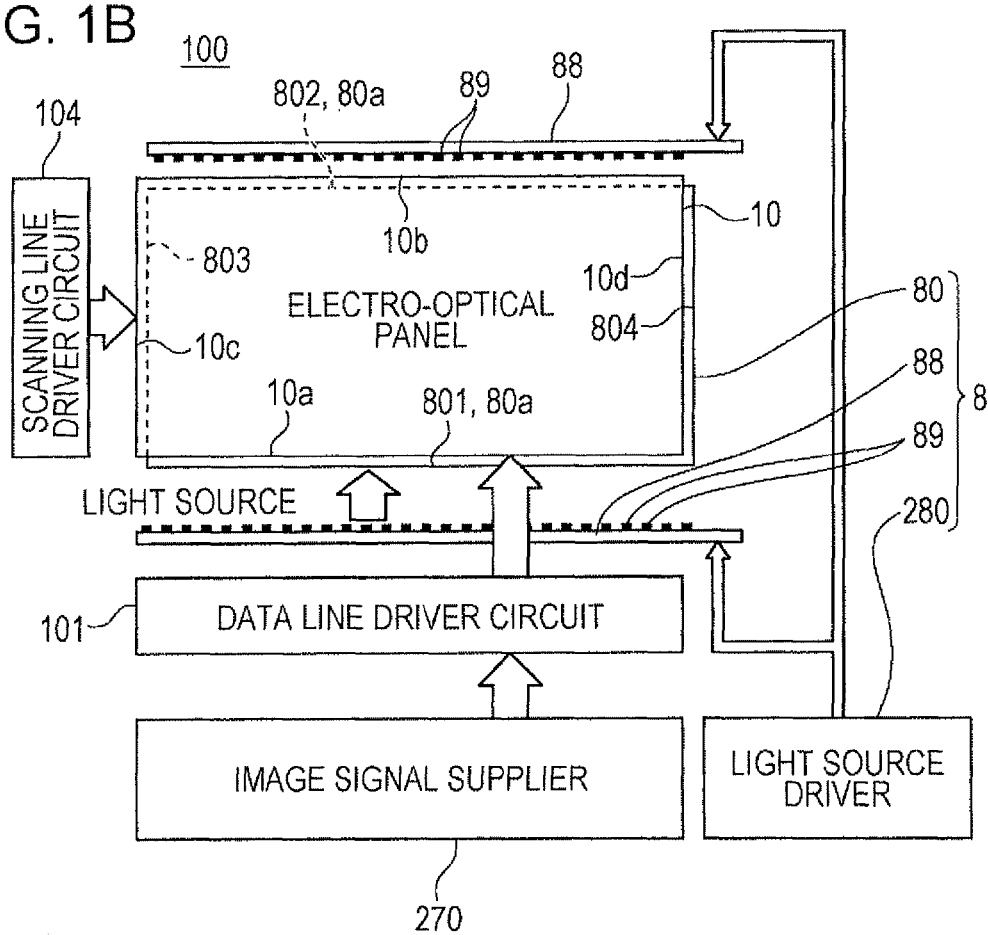

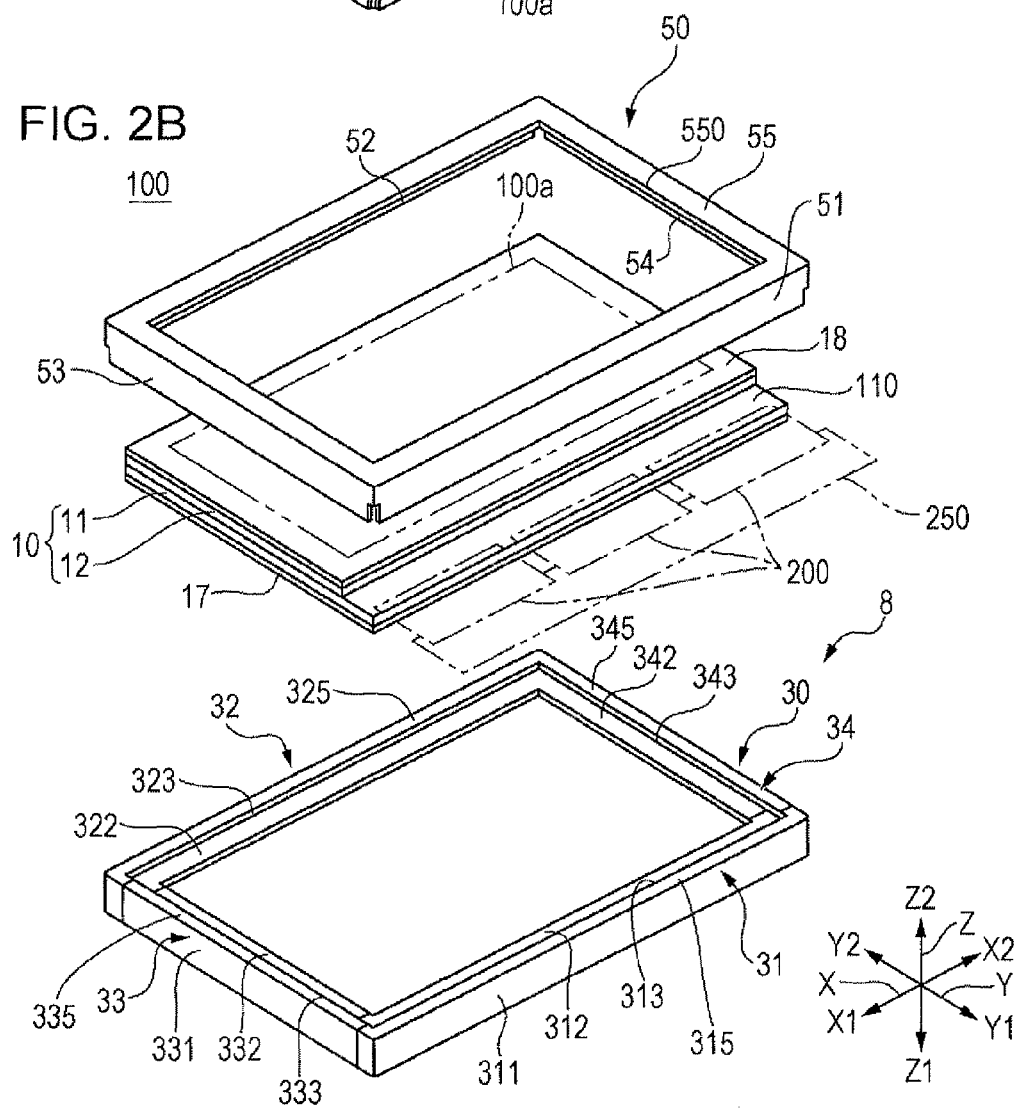

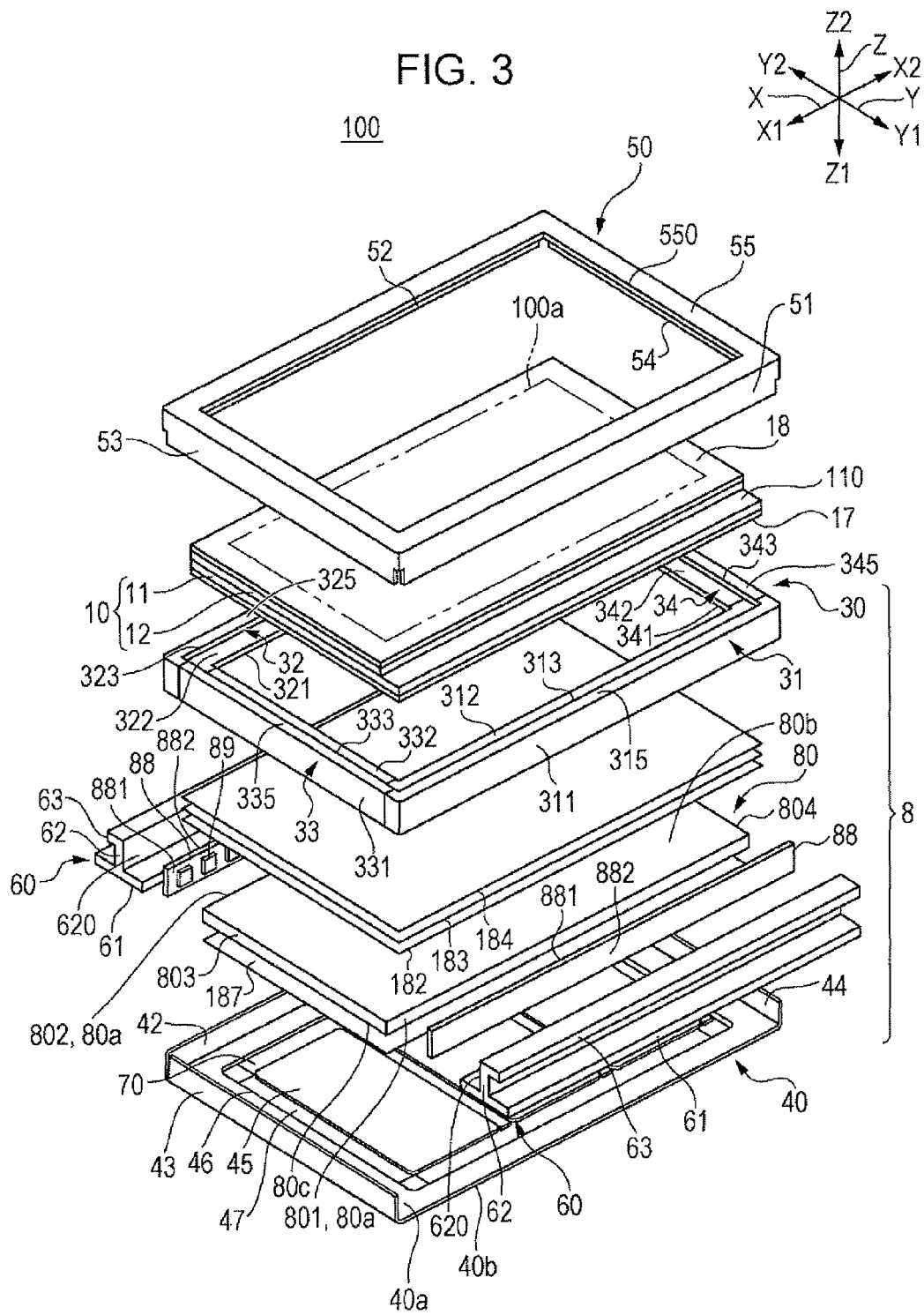

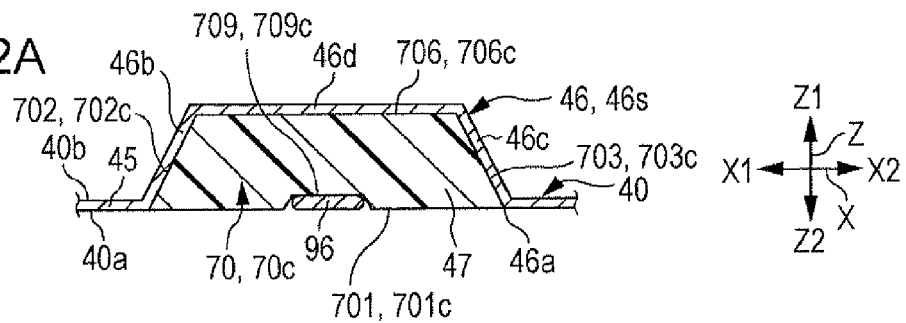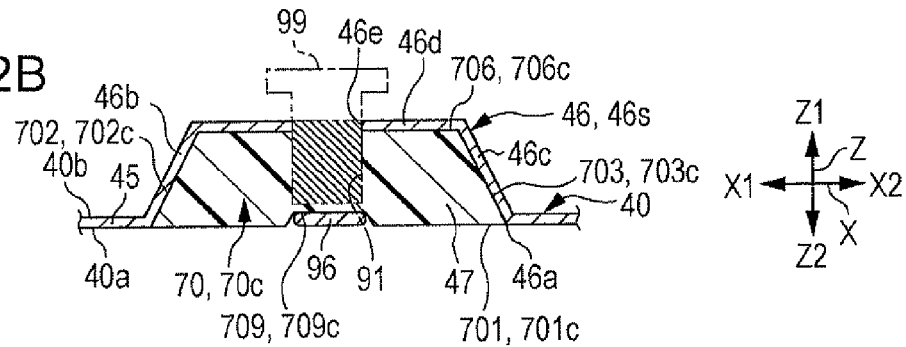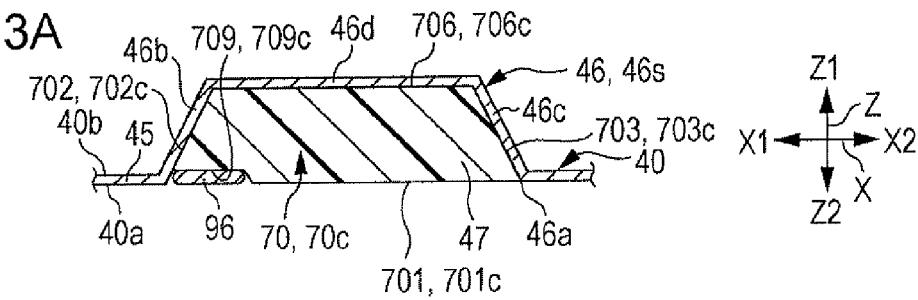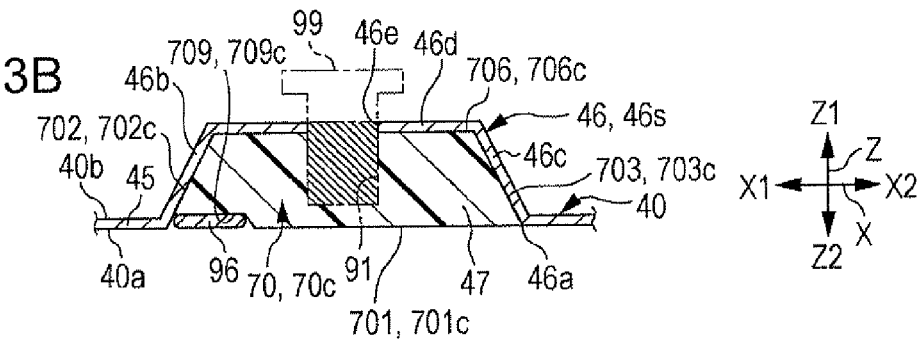

ELECTRO-OPTICAL DEVICE WITH REINFORCING STRUCTURE AND ELECTRONIC APPARATUS HAVING THE ELECTRO-OPTICAL DEVICE

BACKGROUND

1. Technical Field

The present invention relates to an electro-optical device that includes a backup plate supporting an electro-optical panel on the back face thereof, and an electronic apparatus that includes the electro-optical device.

2. Related Art

Electra-optical devices include an electro-optical panel such as an LCD panel or an organic electroluminescence display panel retained by a casing, and the casing includes a backup plate disposed to overlap the electro-optical panel, on the back face thereof.

Generally the backup plate is formed of a resin material, and a reinforcing member formed of a metal plate is superposed on substantially the entirety of the back face of the backup plate, for example as disclosed in JP-A-2003-15530.

However, disposing the backup plate to overlap the electro-optical panel on the back face thereof is insufficient to prevent deflection of the electro-optical panel, and besides the structure according to JP-A-2003-15530 that includes the resin backup plate and the metal reinforcing member superposed on each other leads to an increase in weight of the electro-optical device.

SUMMARY

An advantage of some aspect of the invention is provision of an electro-optical device configured so as to effectively reinforce a backup plate disposed to overlap an electro-optical panel on the back face thereof, and an electronic apparatus including such an electro-optical device.

In an aspect, the invention provides an electro-optical device including an electro-optical panel, a backup plate disposed to overlap the electro-optical panel and including a groove portion recessed in a direction opposite to the electro-optical panel, and a groove reinforcement region including a reinforcing member, the reinforcing member being fixed to the backup plate inside the groove portion and extending along the groove portion, such that a surface of the reinforcing member on the side of the electro-optical panel is located within a depth of the groove portion.

In the electro-optical device thus configured, the backup plate is disposed to overlap the electro-optical panel on the back face opposite to the side to which display light is emitted, and the backup plate includes the groove portion recessed from the front face and protruding on the back face. In addition, the backup plate includes the groove reinforcement region including the reinforcing member extending through inside of the groove portion. Accordingly, the backup plate is effectively reinforced by the groove portion and the reinforcing member in the groove reinforcement region, and hence resistant to deflection. The mentioned configuration of the backup plate effectively suppresses deflection of the electro-optical panel. Further, since the reinforcing member is only provided in a limited location (inside the groove portion), the electro-optical device can be manufactured in a lighter weight compared with the structure in which the reinforcing member is superposed on the entirety of the back face of the backup plate. Furthermore, since the groove portion is recessed from the front face of the backup plate, a sheet or a plate-shaped member is prevented from being elevated when superposed on the backup plate.

Preferably, the backup plate may include a plurality of groove portions each of which oriented parallel to one of the sides of the electro-optical panel, and at least one of the groove portions may include the reinforcing member to form the groove reinforcement region. The mentioned configuration suppresses deflection of the electro-optical device, even when the electro-optical device is set upright on a stand or suspended with a hanger.

Preferably, the reinforcing member may include a frontal portion covering the opening of the groove portion on the side of the electro-optical panel, and a pair of side portions respectively superposed on inner side walls of the groove portion opposing each other. The mentioned configuration of the reinforcing member effectively suppresses deflection of the backup plate.

The reinforcing member may be formed of a metal plate, and bent along the inner side walls in the groove reinforcement region.

Preferably, at least a part of the groove reinforcement region may include a wiring member (a wiring harness) extending through inside of the groove reinforcement region. The mentioned configuration allows the wiring harness to be routed inside the groove portion, thereby saving the space for routing the wiring harness.

The wiring member (The wiring harness) may be disposed inside the reinforcing member so as to extend along the groove reinforcement region.

at least a part of the frontal portion may include a recessed portion formed to recede in the depth direction of the groove portion, and a wiring member (a wiring harness) may be disposed inside the recessed portion so as to extend along the groove reinforcement region. The mentioned configuration allows the wiring harness to be routed along the groove reinforcement region and inside the groove portion, without being covered with the reinforcing member, thereby facilitating the setting and removal of the wiring harness.

Preferably, in the groove reinforcement region the groove portion may include a bottom portion formed on the side thereof protruding in a direction opposite to the electro-optical panel, and a member including a threaded hole open toward the bottom portion may be fixed to the reinforcing member. The mentioned configuration allows the electro-optical device to be mounted on a stand or connected to a hanger, with a screw engaged with the threaded hole. In addition, since the threaded hole is located at the position corresponding to the groove reinforcement region on the backup plate, sufficient mechanical strength can be secured at the joint portion when the electro-optical device is mounted on a stand or connected to a hanger with the screw engaged with the threaded hole.

The reinforcing member in the groove reinforcement region may be formed of a resin member integrally with the backup plate so as to fill in the groove portion. In this case, the backup plate and the reinforcing member (resin member) in the groove reinforcement region are integrally formed by a composite molding process such as insert molding or outsert molding. Therefore, the electro-optical device can be more efficiently assembled than in the case where the backup plate and the reinforcing member are separately prepared. Further, a wiring member (a wiring harness) may be provided inside at least a part of the resin member, so as to extend along the groove reinforcement region.

In the mentioned configuration, it is preferable that in the groove reinforcement region the groove portion includes a bottom portion formed on the side thereof protruding in a direction opposite to the electro-optical panel, and the resin member includes a threaded hole open toward the bottom portion. The mentioned configuration allows the electro-optical device to be mounted on a stand or connected to a hanger, with a screw engaged with the threaded hole. In addition, since the threaded hole is located at the position corresponding to the groove reinforcement region on the backup plate, sufficient mechanical strength can be secured at the joint portion when the electro-optical device is mounted on a stand or connected to a hanger with the screw engaged with the threaded hole.

Preferably, the bottom portion may include an opening formed at a position corresponding to the threaded hole. The mentioned configuration allows the electro-optical device to be mounted on a stand or connected to a hanger, with a screw engaged with the threaded hole. In addition, since the threaded hole is located at the position corresponding to the groove reinforcement region on the backup plate, sufficient mechanical strength can be secured at the joint portion when the electro-optical device is mounted on a stand or connected to a hanger with the screw engaged with the threaded hole.

The foregoing electro-optical device is applicable to electronic apparatuses such as a liquid crystal TV.

BRIEF DESCRIPTION OF THE DRAWINGS

The invention will be described with reference to the accompanying drawings, wherein like numbers reference like elements.

FIG. 1A is a schematic front view of a liquid crystal TV (electronic apparatus) including an electro-optical device according to a first embodiment of the invention, and FIG. 1B is a block diagram of the electro-optical device.

FIGS. 2A and 2B are a perspective view and an exploded perspective view respectively, showing the electro-optical device according to the first embodiment.

FIG. 3 is an exploded perspective view of the electro-optical device according to the first embodiment, showing further details.

FIGS. 12A and 12B are enlarged fragmentary cross-sectional views of a backup plate included in an electro-optical device according to an eighth embodiment of the invention.

FIGS. 13A and 13B are enlarged fragmentary cross-sectional views of a backup plate included in an electro-optical device according to a ninth embodiment of the invention.

DESCRIPTION OF EXEMPLARY EMBODIMENTS

Figure 4A:
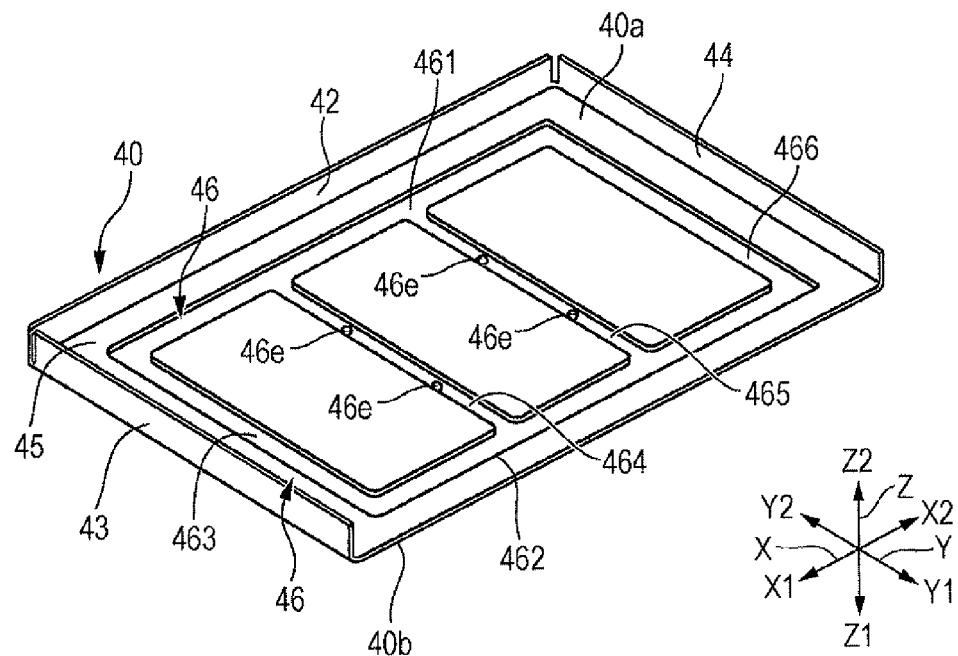
FIGS. 4A and 4B are perspective views showing a backup plate included in the electro-optical device according to the first embodiment.

Referring to the drawings, embodiments of the invention will be described hereunder, in which an electro-optical device for a liquid crystal TV is taken up as an example. In the drawings hereafter referred to, different scales are employed for layers and constituents for the sake of clearer visual recognition. In the following description, further, directions intersecting each other in the plane of a light guide plate or an electro-optical panel will be referred to as X-axis direction (horizontal direction) and Y-axis direction (vertical direction), and a direction intersecting both of the X-axis direction and the Y-axis direction will be referred to as Z-axis direction. One side of the X-axis direction (left side viewed from the front) will be referred to as X1-side and the other side (right side viewed from the front) will be referred to as X2-side. Likewise, one side of the Y-axis direction (lower side of the electro-optical panel) will be referred to as Y1-side and the other side (upper side of the electro-optical panel) will be referred to as Y2-side. In addition, one side of the Z-axis direction (back side, opposite to the side to which illuminating light and display light are emitted) will be referred to as Z1-side and the other side (front side, from which the illuminating light and the display light are emitted) will be referred to as Z2-side.

First Embodiment

General Configuration

FIG. 1A is a schematic front view of a liquid crystal TV (electronic apparatus) including an electro-optical device according to a first embodiment of the invention, and FIG. 1B is a block diagram showing an electrical configuration of the electro-optical device.

An electronic apparatus 2000 shown in FIG. 1A is a liquid crystal TV, which includes an electro-optical device 100, a TV frame 2010, and a TV stand 2020. The electro-optical device 100 includes an electro-optical panel 10 constituted of a transmissive LCD panel, an image signal supplier 270 that supplies image signals to the electro-optical panel 10, and a lighting device 8 serving as a backlight that illuminates the electro-optical panel 10 from the back face. The electro-optical device 100 includes a scanning line driver circuit 104 that drives scanning lines extending in the electro-optical panel 10 in the X-axis direction and a data line driver circuit 101 that drives data lines extending in the electro-optical panel 10 in the Y-axis direction. Both the scanning line driver circuit 104 and the data line driver circuit 101 may be mounted inside the electro-optical panel 10. Alternatively, one of the scanning line driver circuit 104 and the data line driver circuit 101 may be mounted inside the electro-optical panel 10 and the other may be incorporated in a driver IC COG-mounted in the electro-optical panel 10, or incorporated in a driver IC mounted on a circuit board electrically connected to the electro-optical panel 10. Further, both of the scanning line driver circuit 104 and the data line driver circuit 101 may be incorporated in a driver IC independently provided for the electro-optical panel 10.

The lighting device 8 includes a light guide plate 80 disposed to overlap the electro-optical panel 10, a plurality of light-emitting elements 89 aligned along one of the side faces of the light guide plate 80 that serves as a light-receiving surface 80a, a light source substrate 88 on which the light-emitting elements 89 are mounted, and a light source driver 280 that drives the light-emitting elements 89. The electro-optical panel 10 is of a rectangular shape having four sides 10a, 10b, 10c, 10d. Out of the sides 10a, 10b, 10c, 10d, the side 10a is a longer side on the Y1-side in the Y-axis direction, the side 10b is the other longer side on the Y2-side in the Y-axis direction, the side 10c is a shorter side on the X1-side in the X-axis direction, and the side 10d is the other shorter side on the X2-side in the X-axis direction. In correspondence to such a configuration, the light guide plate 80 includes four side faces 801, 802, 803, 804. Out of the side faces 801, 802, 803, 804, the side face 801 corresponds to the longer side on the Y1-side in the Y-axis direction, the side face 802 corresponds to the other longer side on the Y2-side in the Y-axis direction, the side face 803 corresponds to the shorter side on the X1-side in the X-axis direction, and the side face 804 corresponds to the other shorter side on the X2-side in the X-axis direction. Out of the side faces 801, 802, 803, 804 of the light guide plate 80, the side faces 801, 802 opposing each other in the vertical direction (Y-axis direction) serve as the light-receiving surface 80a. Accordingly, the light-emitting elements 89 are aligned along the two side faces 801, 802 (light-receiving surfaces 80a) of the light guide plate 80, and the light source substrate 88 is disposed along these side faces 801, 802 (light-receiving surfaces 80a) of the light guide plate 80.

Specific Configuration of Electro-Optical Device 100

FIGS. 2A and 2B are a perspective view and an exploded perspective view respectively, showing a general configuration of the electro-optical device 100 according to the first embodiment. FIG. 3 is an exploded perspective view of the electro-optical device 100 according to the first embodiment, showing further details.

As shown in FIGS. 2A, 2B and 3, the lighting device 8 includes a backup plate 40 disposed to cover the back face (Z1-side in the Z-axis direction) of the light guide plate 80, a resin frame 30 disposed forward of the backup plate 40 to hold the edges of the electro-optical panel 10 and surround the lighting device 8, and a metal frame 50 disposed forward (Z2-side in the Z-axis direction) of the resin frame 30.

The resin frame 30 has a rectangular frame shape that surrounds the electro-optical panel 10 so as to hold the edges thereof. In this embodiment, the resin frame 30 is composed of four frame plates 31, 32, 33, 34 respectively constituting the four sides of the electro-optical panel 10. The resin frame 30 is formed in a black color so as to serve as a light-absorber that suppresses emergence of stray light in the lighting device 8. The frame plates 31, 32, 33, 34 respectively include side plates 311, 321, 331, 341 extending toward the back of the frame plates 31, 32, 33, 34, front faces 315, 325, 335, 345 inwardly bent from the respective front edges of the side plates 311, 321, 331, 341, and protruding plates 312, 322, 332, 342 bulging inward from halfway of the inner surface of the frame plate 31, 32, 33, 34 in the height direction. The protruding plates 312, 322, 332, 342 respectively define stepped portions 313, 323, 333, 343 inside the frame plates 31, 32, 33, 34, so that the electro-optical panel 10 is retained by the protruding plates 312, 322, 332, 342 and the stepped portions 313, 323, 333, 343. In addition, the light guide plate 80 and the light-emitting elements 89 of the lighting device 8 are located under the protruding plates 312, 322, 332, 342.

The backup plate 40 is formed by pressing a thin metal plate, for example a stainless steel plate. The backup plate 40 includes a bottom plate 45 and three side plates 42, 43, 44 respectively erected from the peripheral edges of the bottom plate 45 corresponding to three sides, except for the side on the Y1-side in the Y-axis direction, and the side plates 321, 331, 341 of the resin frame 30 are respectively disposed to cover the side plates 42, 43, 44 of the backup plate 40. In addition, the side plate 311 of the resin frame 30 covers the edge of the backup plate 40 on the Y1-side in the Y-axis direction.

The metal frame 50 is also formed by pressing a thin metal plate, for example a stainless steel plate, like the backup plate 40. The metal frame 50 includes a frontal portion 55 and four side plates 51, 52, 53, 54 downwardly bent from the peripheral edge of the frontal portion 55, thus forming a rectangular box shape having an opening directed downward. The side plates 51, 52, 53, 54 are respectively disposed to cover the side plates 311, 321, 331, 341 of the resin frame 30. The frontal portion 55 of the metal frame 50 defines a rectangular window 550 through which the light outputted from the electro-optical panel 10 is emitted, and covers the entire perimeter of the electro-optical panel 10 on the side to which the display light is emitted. In addition, the frontal portion 55 fully covers the front faces 315, 325, 335, 345 of the resin frame 30.

The metal frame 50, the resin frame 30, and the backup plate 40 configured as above are combined with screws (not shown) or the like, with the electro-optical panel 10 and the lighting device 8 retained therein. Thus, the backup plate 40 supports the electro-optical panel 10 via the lighting device 8.

Configuration of Electro-Optical Panel 10

The electro-optical panel 10 is an LCD panel of a rectangular shape in a plan view, and includes an element substrate 11 with pixel electrodes (not shown) formed thereon, a counter substrate 12 opposed to the element substrate 11 with a predetermined clearance therebetween, and a rectangular frame-shaped seal material (not shown) that bonds the counter substrate 12 and the element substrate 11 together. The outline of the configuration of the electro-optical panel 10 is as follows. A liquid crystal layer is provided in the region surrounded by the seal material. The element substrate 11 and the counter substrate 12 are constituted of a light-transmissive substrate such as a glass substrate. The element substrate 11 includes a plurality of scanning lines extending in the X-axis direction and a plurality of data lines extending in the Y-axis direction, and switching elements and the pixel electrodes (not shown) are respectively provided at the intersections of the scanning line and the data line.

In this embodiment, the counter substrate 12 is located on the side to which the display light is emitted, and the element substrate 11 is located on the side of the lighting device 8. The counter substrate 12 includes a frame layer formed of a rectangular frame-shaped light-shielding layer along the four sides of the seal member, on the surface of the counter substrate 12 opposing the element substrate 11. The region defined by inner edges of the frame layer serves as an image display region 100a.

The electro-optical panel 10 may be of a twisted nematic (TN) type, an electrically controlled birefringence (ECB) type, or a vertical aligned nematic (VAN) type. The element substrate 11 includes the pixel electrodes and the counter substrate 12 includes a common electrode (not shown). In the case where an in-plane switching (IPS) mode or a fringe field switching (FFS) mode is adopted in the electro-optical panel 10, the common electrode is provided on the element substrate 11. Alternatively, the element substrate 11 may be located forward of the counter substrate 12 in the direction in which the display light is emitted. An upper polarizing plate 18 is disposed to overlap the upper face of the electro-optical panel 10, and a lower polarizing plate 17 is interposed between the back face of the electro-optical panel 10 and the lighting device 8.

In this embodiment, the element substrate 11 is larger than the counter substrate 12. Accordingly, the element substrate 11 includes a bulging portion 110 protruding to the Y1-side in the Y-axis direction from an edge of the counter substrate 12, and a plurality of flexible wiring substrates 200 are connected to the bulging portion 110. The flexible wiring substrates 200 are connected to a common wiring substrate 250. Thus, signals are inputted to the image signal supplier 270 and the scanning line driver circuit 104, described above with reference to FIG. 1B, through the flexible wiring substrates 200 and the common wiring substrate 250.

Configuration of Lighting Device 8

The lighting device 8 includes the light guide plate 80 disposed to overlap the back face of the electro-optical panel 10, and the plurality of light-emitting elements 89 aligned in a direction from an end portion (X-1 side in the X-axis direction) toward the other end portion thereof (X-2 side in the X-axis direction) with the respective light-emitting surfaces 89a of the light-emitting elements 89 oriented to oppose the light-receiving surface 80a of the light guide plate 80. The light-emitting elements 89 are mounted on the first surface 881 of the light source substrate 88 extending along the light-receiving surface 80a in the X-axis direction. The light-emitting elements 89 are constituted of light-emitting diodes (LED) that emit white light, and serve as the light source that emits diverging light.

In the lighting device 8, two side faces 801, 803 out of the side faces 801, 802, 803, 804 of the light guide plate 80, opposing each other in the Y-axis direction, are utilized as the light-receiving surface 80a. Thus, the plurality of light-emitting elements 89 are aligned in a row along each of the two light-receiving surfaces 80a (side faces 801, 803) of the light guide plate 80 in a direction from an end portion toward the other end portion thereof, with the light-emitting surfaces 89a oriented to oppose the light-receiving surface 80a. Two light source substrates 88 are respectively provided along the light-receiving surfaces 80a (side faces 801, 802), and the light-emitting elements 89 are mounted on the first surface 881 of each of the two light source substrates 88.

The light guide plate 80 is formed of a light-transmissive resin such as an acrylic resin or a polycarbonate resin. A reflecting sheet 187 is interposed between the back face 80c of the light guide plate 80 and the bottom plate 45 of the backup plate 40.

Optical sheets including a diffusion sheet 182 and prism sheets 183, 184 are interposed in layers between the front face (light-emitting surface 80b) of the light guide plate 80 and the electro-optical panel 10. The diffusion sheet 182 is formed of a light-transmissive resin such as an acrylic resin or a polycarbonate resin, with a coating layer in which silica particles or the like are dispersed. The pair of prism sheets 183, 184 are oriented such that the respective ridgelines thereof are orthogonal to each other. Accordingly, the illuminating light emitted from the light-emitting surface 80b of the light guide plate 80 is diffused in all directions by the diffusion sheet 182, and then acquires, through the prism sheets 183, 184, a directionality that outputs a peak luminance in a forward direction of the electro-optical panel 10. In the light guide plate 80, fine recessed grooves and scattering patterns formed of a printed layer of a diffuser are provided on the back face 80c opposing the reflecting sheet 187, so that the density of the scattering pattern becomes higher at a position more distant from the light-emitting element 89. Accordingly, the intensity distribution of the illuminating light emitted from the light guide plate 80 becomes uniform irrespective of the distance from the light-emitting element 89. In this embodiment, the scattering pattern is composed of a multitude of fine recessed grooves formed on the back face 80c of the light guide plate 80.

The light source substrate 88 is located such that the first surface 881, on which the light-emitting elements 89 are mounted, opposes the light-receiving surface 80a of the light guide plate 80. In addition, the light source substrate 88 includes a metal plate extending along the light-receiving surface 80a, and a wiring pattern, a land, and an insulation layer are formed on the surface of the metal plate on the side of the first surface 881. Such a structure can be achieved by, for example, attaching a flexible wiring substrate including a resin base layer, the wiring pattern, and an insulating cover layer stacked in this order to the surface of the metal plate on the side of the first surface 881. Thus, electrical insulation is secured between the metal plate and the land on which the wiring pattern and the chip of the light-emitting elements 89 are mounted.

On a second surface 882 of each of the light source substrates 88, a light source support member 60 is provided so as to retain the light source substrate 88, and the light source support member 60 is retained between the backup plate 40 and the resin frame 30. The light source support member 60 is a bar-shaped metal material located so as to extend along the second surface 882 of the light source substrate 88, and includes a base plate 61 placed on the bottom plate 45 of the backup plate 40 and a supporting plate 62 erected upward from halfway of the base plate 61 in the width direction. The light source support member 60 is fixed to the light source substrate 88 via plane-contact between the entirety of the second surface 882 and an abutment surface 620 of the supporting plate 62. Further, the light source support member 60 includes a front plate 63 bent in the direction opposite the light guide plate 80 from the upper edge of the supporting plate 62 (opposite the base plate 61), and the front plate 63 is fixed to at least one of the frontal portion 55 of metal frame 50 and the front faces 315, 325 of the resin frame 30, with screws or the like.

Reinforcement Structure of Base Plate 40

Figure 4B:
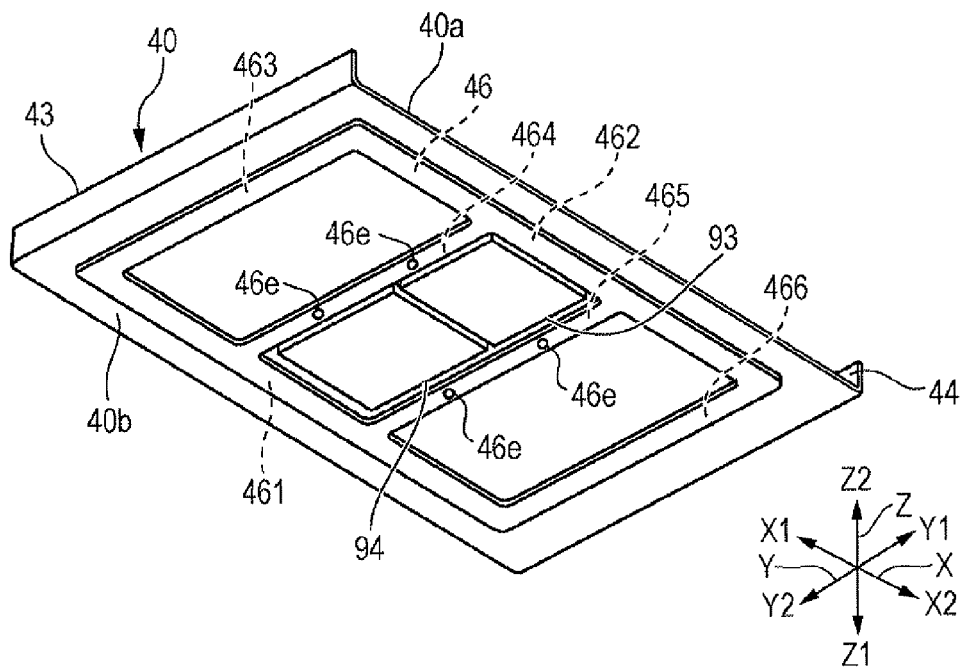
Figure 5A:
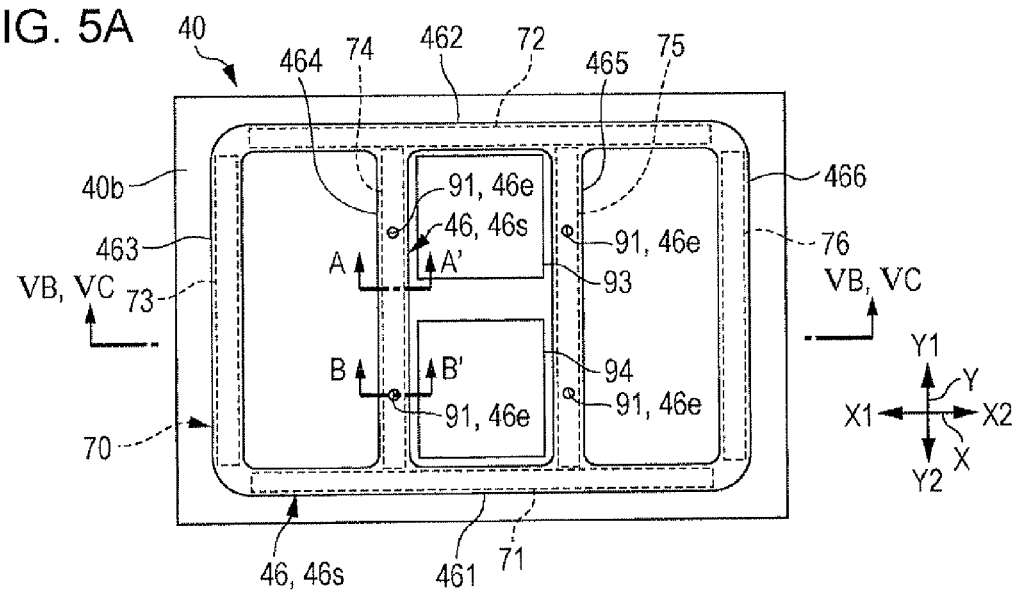
FIG. 5A is a plan view.
Figure 5B:
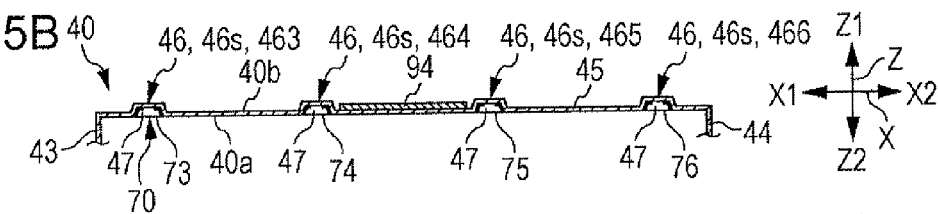
FIGS. 5B and 5C are schematic cross-sectional views.
Figure 5C:
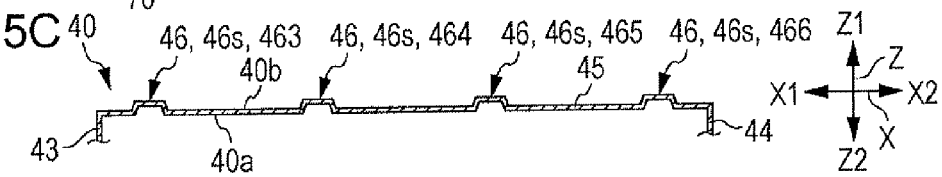
Figure 5D:
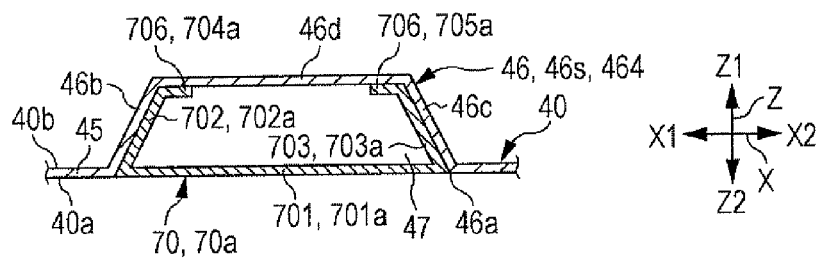
FIGS. 5D and 5E are enlarged fragmentary cross-sectional views, for explaining a reinforcement structure of the backup plate included in the electro-optical device according to the first embodiment.

FIGS. 4A and 4B are perspective views showing the backup plate 40 in the electro-optical device 100 according to the first embodiment, viewed from the front and from the back, respectively. FIGS. 5A to 5E are drawings for explaining the reinforcement structure of the backup plate 40 in the electro-optical device 100 according to the first embodiment, FIG. 5A being a plan view of the back face of the backup plate 40, FIG. 5B being a cross-sectional view taken along a line VB-VB in FIG. 5A, FIG. 5C being a cross-sectional view taken along a line VC-VC in FIG. 5A showing the backup plate 40 without a reinforcing member 70, FIG. 5D being a cross-sectional view taken along a line A-A' in FIG. 5A, and FIG. 5E being cross-sectional view taken along a line B-B' in FIG. 5A.

As shown in FIGS. 3 to 5E, the backup plate 40 included in the electro-optical device 100 according to this embodiment includes a reinforcing groove (groove portion) 46 formed on the bottom plate 45, to increase the strength of the bottom plate 45 disposed to overlap the electro-optical panel 10 via the light guide plate 80 and the reflecting sheet 187. The reinforcing groove 46 is recessed from the front face 40a on the side of the electro-optical panel 10, and protrudes from the back face 40b in a direction opposite to the electro-optical panel 10 thus forming a rib portion 46s. In this embodiment, the reinforcing groove 46 includes four vertical grooves 463, 464, 465, 466 extending in the Y-axis direction (vertical direction) and aligned in the X-axis direction (horizontal direction), and two horizontal grooves 461, 462 extending in the X-axis direction so as to connect the respective end portions of the vertical grooves 463, 464, 465, 466 in the Y-axis direction. The vertical grooves 463, 464, 465, 466 prevent the backup plate 40 from deflecting in the Z-axis direction along the Y-axis, and the horizontal grooves 461, 462 prevent the backup plate 40 from deflecting in the Z-axis direction along the X-axis.

Circuit boards 93, 94 are respectively located in recessed regions on the back face 40b of the backup plate 40 surrounded by the rib portions 46s corresponding to the vertical grooves 463, 464 and the horizontal grooves 461, 462. The circuit boards 93, 94 are electrically connected to the wiring substrate 250 shown in FIG. 2 and the light source substrate 88 shown in FIGS. 1B and 3. Here, the circuit board 94 is not shown in FIGS. 5C, 5D, and 5E.

A reinforcing member 70 is provided through inside of the reinforcing groove 46, to constitute a groove reinforcement region 47. In this embodiment, the reinforcing member 70 is provided along substantially the entirety of the reinforcing groove 46. To be more detailed, the reinforcing member 70 is composed of vertical portions 73, 74, 75, 76 extending in the Y-axis direction (vertical direction) inside the vertical grooves 463, 464, 465, 466, respectively, and horizontal portions 71, 72 extending in the X-axis direction (horizontal direction) inside the horizontal grooves 461, 462, respectively. In this embodiment, the vertical portions 73, 74, 75, 76, and the horizontal portions 71, 72 are each provided as an independent member, and the reinforcing member 70 is disconnected at corner portions of the reinforcing groove 46, i.e., between the vertical portion 73 and the horizontal portions 71, 72, and between the vertical portion 76 and the horizontal portions 71, 72. In contrast, the end portions of the vertical portions 74, 75 are connected to lateral portions of the horizontal portions 71, 72.

The reinforcing member 70 is fixed to the backup plate 40 inside the reinforcing groove 46 in the groove reinforcement region 47, and extends along the reinforcing groove 46 in contact with inner side walls 46b, 46c, such that a front face 701 (frontal portion) of the reinforcing member 70 on the side of the electro-optical panel 10 is located within the depth of the reinforcing groove 46. To be more detailed, the reinforcing groove 46 has a trapezoidal cross-sectional shape, and the vertical portions 73, 74, 75, 76 and the horizontal portions 71, 72 of the reinforcing member 70 each include the front face 701 (frontal portion) covering the opening 46a of the reinforcing groove 46 in the front face 40a of the backup plate 40, and a pair of side faces 702, 703 respectively superposed on the inner side walls 46b, 46c of the reinforcing groove 46 opposing each other. Further, the vertical portions 73, 74, 75, 76 and the horizontal portions 71, 72 of the reinforcing member 70 each include a bottom portion 706 superposed on a bottom plate 46d of the reinforcing groove 46. The side faces 702, 703 of the reinforcing member 70 are in contact with the inner side walls 46b, 46c of the reinforcing groove 46, and the bottom portion 706 of the reinforcing member 70 is in contact with the bottom plate 46d of the reinforcing groove 46. In addition, the front face 701 of the reinforcing member 70 on the side of the electro-optical panel 10 is located between the inner side walls 46b, 46c of the reinforcing groove 46, without protruding from the backup plate 40 toward the electro-optical panel 10.

In this embodiment, the reinforcing member 70 is formed of a metal plate 70a bent along the cross-sectional shape of the reinforcing groove 46. The metal plate 70a includes a front plate 701a covering the opening 46a of the reinforcing groove 46, and side plates 702a, 703a extending from the respective end portions of the front plate 701a in the width direction and superposed on the inner side walls 46b, 46c of the reinforcing groove 46. The metal plate 70a is fixed to the backup plate 40 by welding or screws. The metal plate 70a also includes an edge plate 704a bent from the side plate 702a along the bottom plate 46d of the reinforcing groove 46, and an edge plate 705a bent from the side plate 703a along the bottom plate 46d of the reinforcing groove 46. In the thus-configured metal plate 70a, the front plate 701a constitutes the front face 701 of the reinforcing member 70, and the side plates 702a, 703a constitute the side faces 702, 703 of the reinforcing member 70. The edge plate 704a and the edge plate 705a are generally the same in width. The total of the width of the edge plate 704a and the width of the edge plate 705a is smaller than the width of the bottom plate 46d. In other words, the bottom plate 46d is partially exposed between the edge plate 704a and the edge plate 705a, and the edge plates 704a, 705a of the metal plate 70a constitute the bottom portion 706 of the reinforcing member 70.

In the groove reinforcement region 47 of the backup plate 40 configured as above, the rib portion 46s corresponding to the vertical groove 464 includes a pair of openings 46e formed with a predetermined interval therebetween in the vertical (Y-axis) direction. Likewise, the rib portion 46s corresponding to the vertical groove 465 also includes a pair of openings 46e formed with a predetermined interval therebetween in the vertical (Y-axis) direction, in the region overlapping the vertical groove 465. In this embodiment, the openings 46e are located at the middle point in the width direction of the reinforcing groove 46.

In this embodiment, bottomed cylindrical members 90 each including a threaded hole 91 open toward the back face 40b are fixed inside the reinforcing groove 46 in the groove reinforcement region, at the positions respectively corresponding to the openings 46e. In other words, inside the reinforcing groove 46, the bottomed cylindrical members 90 each including the threaded hole 91 open toward the back face 40b are fixed between the bottom plate 46d of the backup plate 40 and the front plate 701a of the metal plate 70a constituting the reinforcing member 70, and the threaded holes 91 are open toward the back face 40b through the opening 46e of the bottom plate 46d between the edge plates 704a, 705a. The cylindrical members 90 are fixed to the bottom plate 46d of the backup plate 40 and the front plate 701a of the metal plate 70a (reinforcing member 70) for example by welding.

Figure 5E:
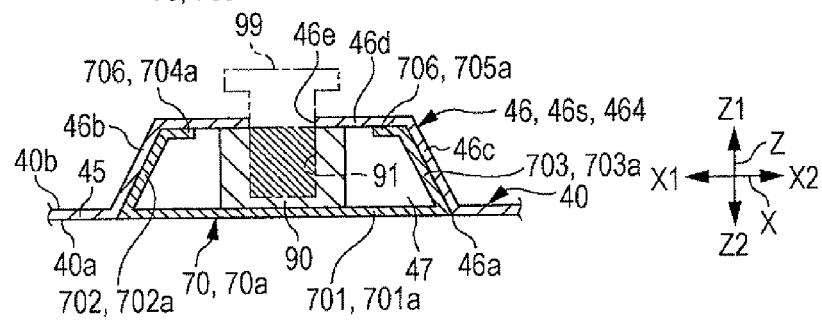

The threaded holes 91 thus provided are used to mount the electro-optical device 100 on the stand 2020 in an upright position as shown in FIG. 1A, by fastening a screw 99 in the threaded hole 91 as shown in FIG. 5E. In the case of suspending the electro-optical device 100 on a wall, the screw 99 engaged with the threaded hole 91 is used to connect the electro-optical device 100 and a hanger.

Advantageous Effects of First Embodiment

As described above, in the electro-optical device 100 according to this embodiment, the backup plate 40 is disposed to overlap the electro-optical panel 10 on the back face opposite to the side to which the display light is emitted, and the backup plate 40 includes the reinforcing groove 46 recessed from the front face 40a thus forming the rib portion 46s on the back face 40b. In addition, the backup plate 40 includes the groove reinforcement region 47 including the reinforcing member 70 extending through inside of the reinforcing groove 46. Accordingly, the backup plate 40 is effectively reinforced by the reinforcing groove 46 and the reinforcing member 70 in the groove reinforcement region 47, and hence resistant to deflection. The mentioned configuration of the backup plate 40 effectively suppresses deflection of the electro-optical panel 10 and the light guide plate 80. Further, since the reinforcing member 70 is only provided in a limited location (inside the reinforcing groove 46), the electro-optical device 100 can be manufactured in a lighter weight compared with the structure in which the reinforcing member is superposed on the entirety of the back face of the backup plate.

In addition, since the reinforcing groove 46 is recessed from the front face 40a of the backup plate 40 thus forming the rib portion 46s on the back face 40b, a sheet or a plate-shaped member is prevented from being elevated when superposed on the backup plate 40.

Further, in the reinforcing groove 46 of the backup plate 40, the vertical grooves 463, 464, 465, 466 and the horizontal grooves 461, 462 all include the reinforcing member 70 to constitute the groove reinforcement region 47. Such a configuration suppresses deflection of the electro-optical device 100, even when the electro-optical device 100 is set upright on the stand 2020 or suspended with a hanger. In addition, since the reinforcing member 70 includes the front face 701 covering the opening 46a of the reinforcing groove 46 and the side faces 702, 703 respectively superposed on the side faces 46b, 46c of the reinforcing groove 46, the reinforcing member 70 serves to effectively increase the rigidity of the backup plate 40 in the reinforcing groove 46.

Still further, in the groove reinforcement region 47, the cylindrical members 90 each including the threaded hole 91 are fixed inside the reinforcing groove 46, and the threaded holes 91 are open toward the back face 40b of the rib portion 46s. Therefore, the electro-optical device 100 can be mounted on the stand 2020 or connected to a hanger, with the screws 99 respectively engaged with the threaded holes 91. In addition, since the threaded holes 91 are located at the positions corresponding to the reinforcing groove 46 on the backup plate 40, sufficient mechanical strength can be secured at the joint portions when the electro-optical device 100 is mounted on the stand 2020 or connected to a hanger with the screws 99 respectively engaged with the threaded holes 91.

Second Embodiment

Figure 6:
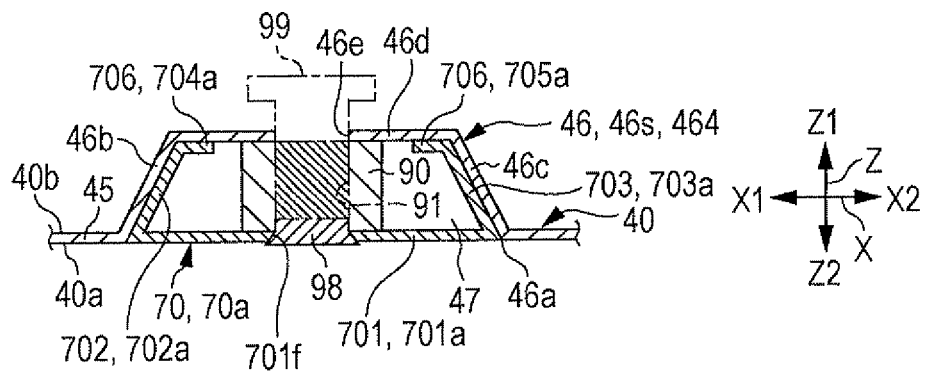
FIG. 6 is an enlarged fragmentary cross-sectional view of a backup plate included in an electro-optical device according to a second embodiment of the invention.

FIG. 6 is a cross-sectional view taken along the line B-B' in FIG. 5A, showing the backup plate 40 included in the electro-optical device 100 according to a second embodiment of the invention. The basic configuration of this embodiment is the same as that of the first embodiment, and therefore the constituents employed in common will be given the same numeral, and the description thereof will not be repeated.

In the first embodiment, the bottomed cylindrical member 90 is employed to provide the threaded hole 91 open toward the back face 40b, in the rib portion 46s of the backup plate 40. Alternatively, as shown in FIG. 6, the cylindrical member 90 located between the bottom plate 46d of the backup plate 40 and the front plate 701a of the metal plate 70a (reinforcing member 70) has openings on the respective end portions in this embodiment. In addition, the cylindrical member 90 is fixed between the front plate 701a of the metal plate 70a (reinforcing member 70) and the bottom plate 46d of the backup plate 40, with a screw 98 inserted through an opening 701f of the front plate 701a into halfway of the threaded hole 91. In this case also, the cylindrical member 90 may be welded to the bottom plate 46d of the backup plate 40 and the front plate 701a of the metal plate 70a (reinforcing member 70), in addition to fastening the screw 98.

With the mentioned configuration, the screw 98 serves as a stopper against the screw 99, when the screw 99 is inserted into the threaded hole 91.

Third Embodiment

Figure 7A:
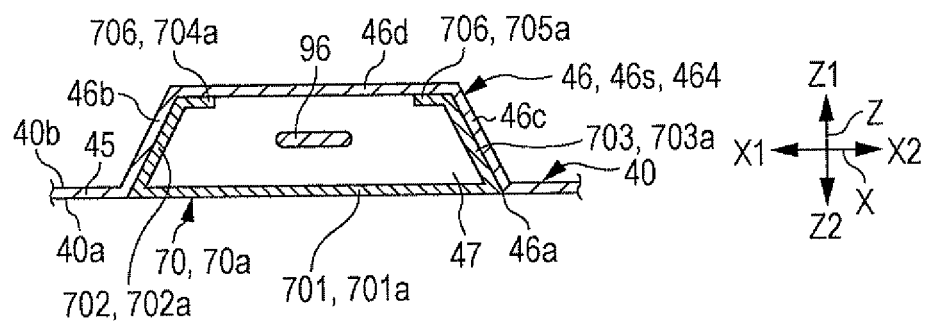
FIGS. 7A and 7B are enlarged fragmentary cross-sectional views of a backup plate included in an electro-optical device according to a third embodiment of the invention.
Figure 7B:
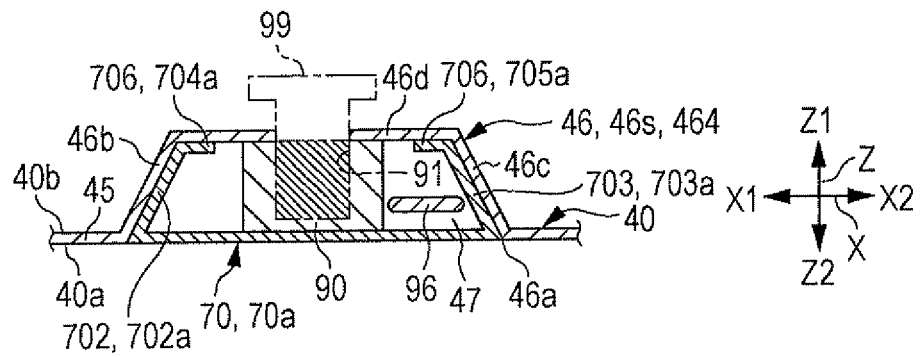

FIGS. 7A and 7B are cross-sectional views respectively taken along the lines A-A' and B-B' in FIG. 5A, showing the backup plate 40 included in an electro-optical device 100 according to a third embodiment of the invention. The basic configuration of this embodiment is the same as that of the first embodiment, and therefore the constituents employed in common will be given the same numeral, and the description thereof will not be repeated.

In this embodiment, as shown in FIG. 7A, a wiring harness 96 is provided through inside of the vertical groove 464 so as to extend along the reinforcing groove 46 shown in FIGS. 5A to 5E. The wiring harness 96 extends from the circuit board 93 shown in FIGS. 4B and 5A to the light source substrate 88 of the lighting device 8.

As mentioned above, the wiring harness 96 extends inside the reinforcing member 70 formed of the metal plate 70a. Such a configuration allows the wiring harness 96 to be routed through inside of the reinforcing groove 46, thereby saving the space necessary for routing the wiring harness 96.

The wiring harness 96 is routed along a generally central portion inside the reinforcing groove 46 as shown in FIG. 7A, through the region in the groove reinforcement region 47 where the threaded hole 91 is not located. In contrast, at the position where the threaded hole 91 is provided, the wiring harness 96 is routed so as to circumvent the cylindrical member 90 inside the reinforcing member 70, as shown in FIG. 7B. In addition, in the case where the end portions of the vertical portion 74 are connected to the side faces of the horizontal portions 71, 72 as shown in FIG. 5A, the wiring harness 96 is routed through a hole formed in the joint portion between the vertical portion 74 and the side faces of the horizontal portions 71, 72, into the horizontal portion 71 or 72.

Fourth Embodiment

Figure 8A:
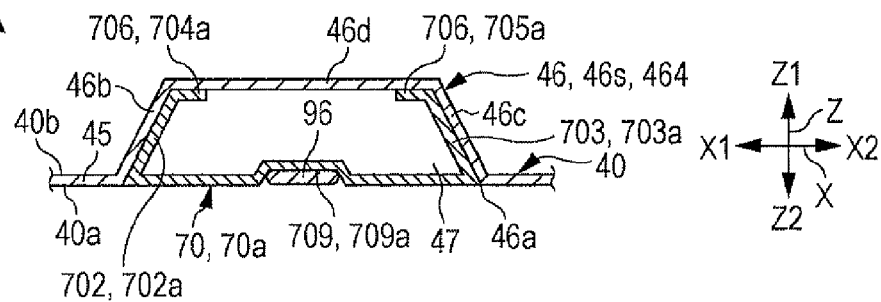
FIGS. 8A and 8B are enlarged fragmentary cross-sectional views of a backup plate included in an electro-optical device according to a fourth embodiment of the invention.
Figure 8B:
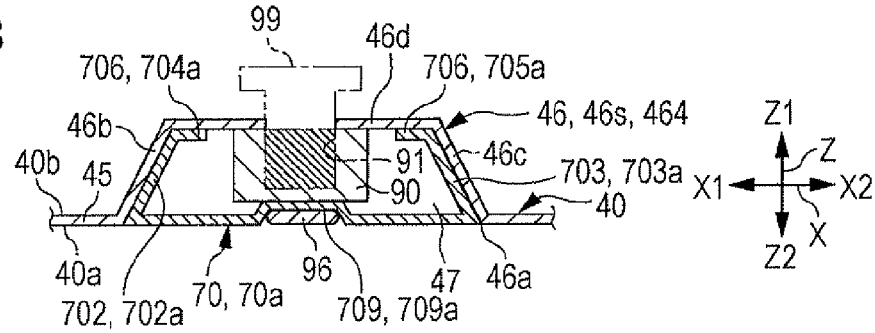

FIGS. 8A and 8B are cross-sectional views respectively taken along the lines A-A' and B-B' in FIG. 5A, showing the backup plate 40 included in an electro-optical device 100 according to a fourth embodiment of the invention.

In this embodiment also, as shown in FIGS. 8A and 8B, in the groove reinforcement region 47 the wiring harness 96 is provided through inside of the vertical groove 464 so as to extend along the reinforcing groove 46 shown in FIGS. 5A to 5E, as in the third embodiment. In this embodiment, the front face 701 of the reinforcing member 70 includes a recessed portion 709 receding toward the back face 40b of the backup plate 40 and extending along the vertical groove 464, and the wiring harness 96 extends through inside of the recessed portion 709. To be more detailed, the metal plate 70a is employed to form the reinforcing member 70 is bent along the inner wall of the reinforcing groove 46 in this embodiment, and the front plate 701a of the metal plate 70a includes a recessed portion 709a, corresponding to the recessed portion 709, receding toward the back face 40b of the backup plate 40, and the wiring harness 96 extends through inside of the recessed portion 709a of the metal plate 70a.

The mentioned configuration allows the wiring harness 96 to be routed along outside (recessed portion 709 (709*a*)) of the reinforcing member 70 (metal plate 70*a*) in the groove reinforcement region 47, thereby facilitating the setting and removal of the wiring harness 96. Here, although in this embodiment the recessed portion 709 (709*a*) is formed along a generally central portion of the reinforcing groove 46 in the width direction, the recessed portion 709 (709*a*) may be formed in a region deviated to either side from the central portion of the reinforcing groove 46 in the width direction.

Fifth Embodiment

Figure 9A:
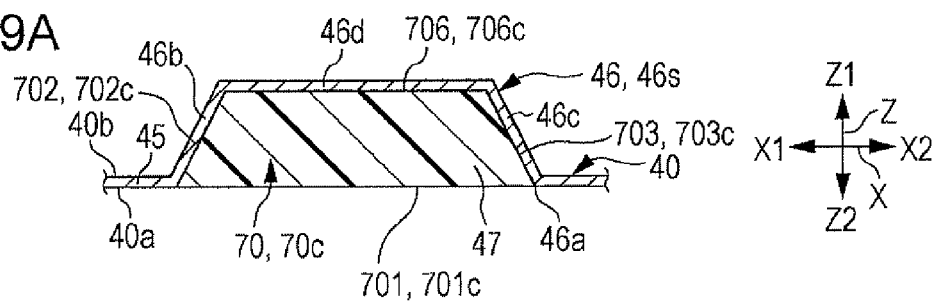
FIGS. 9A and 9B are enlarged fragmentary cross-sectional views of a backup plate included in an electro-optical device according to a fifth embodiment of the invention.
Figure 9B:
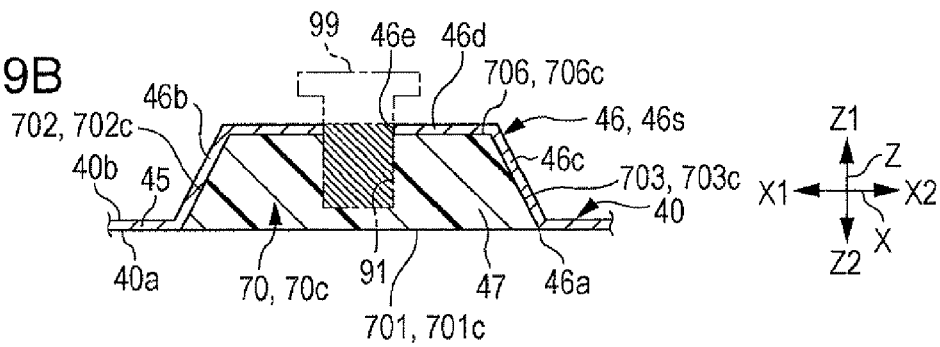

FIGS. 9A and 9B are cross-sectional views respectively taken along the lines A-A' and B-B' in FIG. 5A, showing the backup plate 40 included in an electro-optical device 100 according to a fifth embodiment of the invention.

In this embodiment also, as shown in FIGS. 9A and 9B, the reinforcing groove 46, recessed from the front face 40*a* thus forming the rib portion 46*s* on the back face 40*b*, is provided in the bottom plate 45 of the backup plate 40, as in the first embodiment. In addition, the reinforcing groove 46 includes the reinforcing member 70 extending through inside of the reinforcing groove 46 thus constituting the groove reinforcement region 47, and the reinforcing member 70 includes the front face 701 covering the opening 46*a* of the reinforcing groove 46 and the pair of side faces 702, 703 respectively superposed on the side faces 46*b*, 46*c* of the reinforcing groove 46 opposing each other. Further, the reinforcing member 70 includes the bottom portion 706 superposed on the bottom plate 46*d* of the reinforcing groove 46.

In this embodiment, the backup plate and the reinforcing member is constituted of a resin member 70*c* formed integrally with the backup plate 40 so as to fill in the reinforcing groove 46, by a composite molding process such as insert molding or outsert molding. Accordingly, the reinforcing member 70 constitutes a unified structure in which the entirety thereof is connected. In the reinforcing member 70, a front face 701*c* of the resin member 70*c* constitutes the front face 701 (frontal portion) of the reinforcing member 70, and side faces 702*c*, 703*c* of the resin member 70*c* respectively constitute the side faces 702, 703 of the reinforcing member 70. A bottom portion 706*c* of the resin member 70*c* is superposed on the bottom plate 46*d* of the reinforcing groove 46.

In the groove reinforcement region 47 of the backup plate 40 according to this embodiment, a pair of threaded holes 91 open toward the back face 40*b* are provided at positions spaced from each other halfway of the vertical groove 464 in the vertical (Y-axis) direction. Here, in the vertical groove 465 shown in FIG. 5A also, the threaded holes 91 open toward the back face 40*b* are provided halfway of the vertical groove 465 in the vertical (Y-axis) direction, as in the vertical groove 464. The threaded holes 91 are located at generally central positions of the reinforcing groove 46 in the width direction.

In this embodiment, the threaded holes 91, formed in the resin member 70*c* with the opening oriented to the back face 40*b* of the rib portion 46*s* of the backup plate 40, are located at the positions respectively corresponding to the openings 46*e* formed in the rib portion 46*s* (bottom plate 46*d*).

As described above, in this embodiment also, the backup plate 40 includes the reinforcing groove 46 recessed from the front face 40*a* thus forming the rib portion 46*s* on the back face 40*b*, and the reinforcing member 70 (resin member 70*c*) is provided through inside of the reinforcing groove 46 to constitute the groove reinforcement region 47, as in the first embodiment. Accordingly, the backup plate 40 can be made resistant to deflection, and therefore deflection of the electro-optical panel 10 and the light guide plate 80 can be suppressed. In addition, the backup plate 40 and the reinforcing member 70 (resin member 70*c*) are integrally formed by a composite molding process such as insert molding or outsert molding in this embodiment. Therefore, the electro-optical device 100 can be more efficiently assembled than in the case where the backup plate 40 and the reinforcing member 70 are separately prepared.

Sixth Embodiment

Figure 10A:
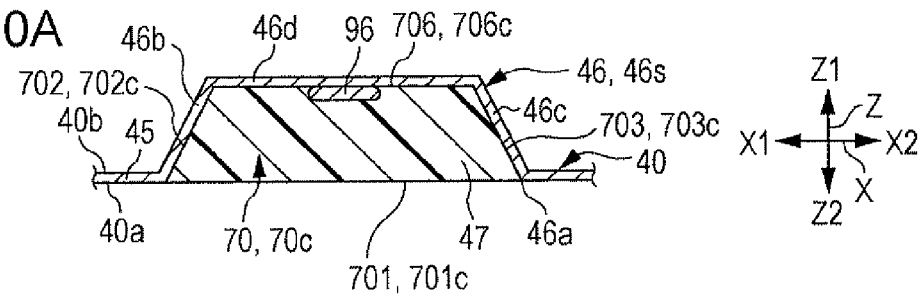
FIGS. 10A and 10B are enlarged fragmentary cross-sectional views of a backup plate included in an electro-optical device according to a sixth embodiment of the invention.
Figure 10B:
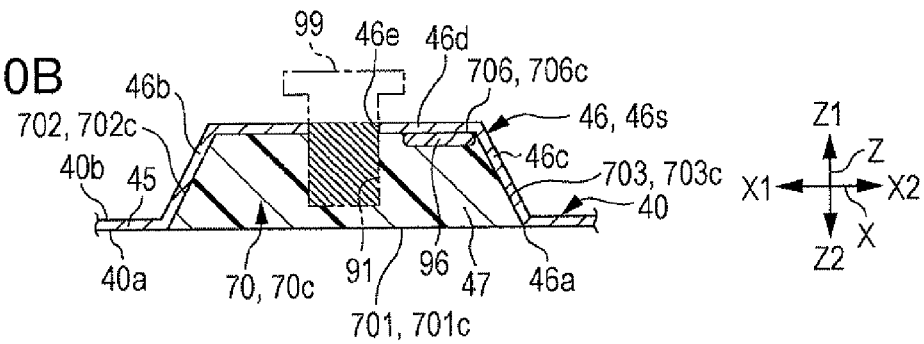

FIGS. 10A and 10B are cross-sectional views respectively taken along the lines A-AT and B-B' in FIG. 5A, showing the backup plate 40 included in an electro-optical device 100 according to a sixth embodiment of the invention.

In this embodiment also, as shown in FIGS. 10A and 10B, the reinforcing groove 46, recessed from the front face 40*a* thus forming the rib portion 46*s* on the back face 40*b*, is provided in the bottom plate 45 of the backup plate 40, and the reinforcing member 70 (resin member 70*c*) is formed so as to extend through inside of the reinforcing groove 46 thus constituting the groove reinforcement region 47, as in the fifth embodiment.

In addition, this embodiment the wiring harness 96 is routed through inside of the vertical groove 464 so as to extend along the reinforcing groove 46 from the circuit board 93 shown in FIGS. 45 and 5A to the light source substrate 88 of the lighting device 8, as in the third embodiment. The wiring harness 96 extends through inside of the reinforcing member 70 formed of the resin member 70*c*, in the groove reinforcement region 47. To be more detailed, the wiring harness 96 is routed through between the resin member 70*c* and the bottom plate 46*d* of the reinforcing groove 46. Such a configuration can be obtained, for example, by routing the wiring harness 96 inside the reinforcing groove 46 when the resin member 70*c* is formed integrally with the backup plate 40 by a composite molding process such as insert molding or outsert molding.

The wiring harness 96 is routed along a generally central portion of the reinforcing groove 46 in the width direction as shown in FIG. 10A, through the region in the groove reinforcement region 47 where the threaded hole 91 is not located, while the wiring harness 96 is routed so as to circumvent the threaded hole 91 as shown in FIG. 10B at the position where the threaded hole 91 is provided.

Seventh Embodiment

Figure 11A:
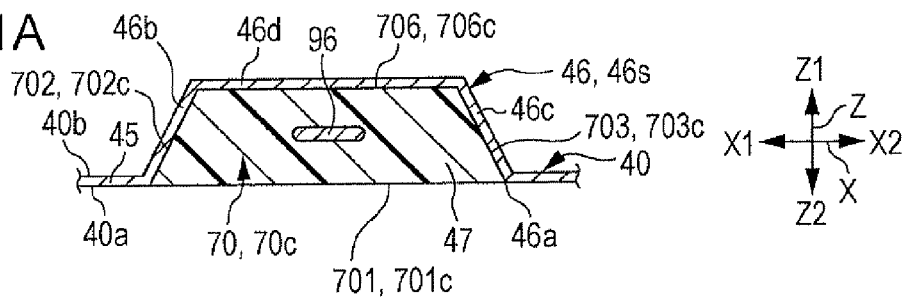
FIGS. 11A and 11B are enlarged fragmentary cross-sectional views of a backup plate included in an electro-optical device according to a seventh embodiment of the invention.
Figure 11B:
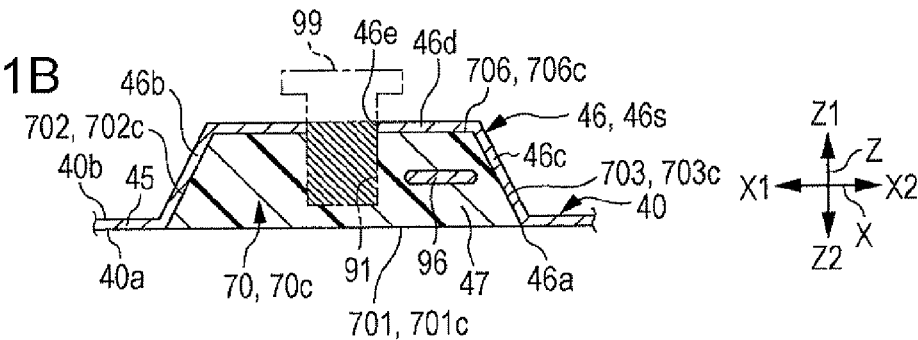

FIGS. 11A and 11B are cross-sectional views respectively taken along the lines A-A' and B-B' in FIG. 5A, showing the backup plate 40 included in an electro-optical device 100 according to a seventh embodiment of the invention.

In this embodiment also, as shown in FIGS. 11A and 11B, the wiring harness 96 is provided through inside of the vertical groove 464 constituting the groove reinforcement region 47, so as to extend along the reinforcing groove 46 shown in FIGS. 5A to 5E, as in the sixth embodiment. In addition, the wiring harness 96 extends through inside of the reinforcing member 70 formed of the resin member 70*c*. Here, the wiring harness 96 is routed along a generally central portion of the resin member 70*c* in the Z-axis direction. Accordingly, the wiring harness 96 is encapsulated in the resin member 70*c*. Such a configuration can be obtained, for example, by routing the wiring harness 96 inside the reinforcing groove 46 when the resin member 70*c* is formed integrally with the backup plate 40 by a composite molding process such as insert molding or outsert molding. Here, the wiring harness 96 is routed along a generally central portion of the reinforcing groove 46 in the width direction as shown in FIG. 11A, through the region in the reinforcing groove 46 where the threaded hole 91 is not located, while the wiring harness 96 is routed so as to circumvent the threaded hole 91 as shown in FIG. 11B at the position where the threaded hole 91 is provided.

Eighth Embodiment

FIGS. 12A and 12B are cross-sectional views respectively taken along the lines A-A' and B-B' in FIG. 5A, showing the backup plate 40 included in an electro-optical device 100 according to an eighth embodiment of the invention.

In this embodiment also, as shown in FIGS. 12A and 12B, the wiring harness 96 is provided through inside of the vertical groove 464 constituting the groove reinforcement region 47, so as to extend along the reinforcing groove 46 shown in FIGS. 5A to 5E, as in the sixth and the seventh embodiment. The front face 701 of the reinforcing member 70 includes the recessed portion 709 receding toward the back face 40b of the backup plate 40 and extending along the vertical groove 464, and the wiring harness 96 extends through inside of the recessed portion 709. To be more detailed, the reinforcing groove 46 is filled with the resin member 70c that constitutes the reinforcing member 70 in this embodiment, and the front face 701c of the resin member 70c includes a recessed portion 709c, corresponding to the recessed portion 709, receding toward the back face 40b of the backup plate 40, and the wiring harness 96 extends through inside of the recessed portion 709c of the resin member 70c. In this embodiment, the recessed portion 709c is located along a generally central portion of the resin member 70c in the width direction.

Such a configuration can be obtained, for example, by forming the recessed portion 709c when molding the resin member 70c, and then routing the wiring harness 96 inside the recessed portion 709c. The configuration according to this embodiment allows the wiring harness 96 to be routed along outside of the reinforcing member 70 (resin member 70c) in the groove reinforcement region 47, thereby facilitating the setting and removal of the wiring harness 96.

Ninth Embodiment

FIGS. 13A and 13B are cross-sectional views respectively taken along the lines A-A' and B-B' in FIG. 5A, showing the backup plate 40 included in an electro-optical device 100 according to a ninth embodiment of the invention.

In this embodiment also, as shown in FIGS. 13A and 13B, the wiring harness 96 is provided through inside of the vertical groove 464 constituting the groove reinforcement region 47, so as to extend along the reinforcing groove 46 shown in FIGS. 5A to 5E, as in the eighth embodiment. The front face 701c of the resin member 70c (reinforcing member 70) includes the recessed portion 709c, and the wiring harness 96 extends through inside of the recessed portion 709c of the resin member 70c.

A difference is that the recessed portion 709c is located at a position deviated to either side from the central position of the resin member 70c in the width direction. In this embodiment, the recessed portion 709c is located at an end portion of the resin member 70c in the width direction. Thus, unlike in the eighth embodiment, the recessed portion 709c is deviated from the threaded hole 91 in this embodiment, and therefore the thickness of the resin member 70c between the front face 701c and the threaded hole 91 is not reduced. Such a configuration secures sufficient strength at the position where the threaded hole 91 is provided, thereby preventing breakdown of the portion around the threaded hole 9 due to lack of strength, when the electro-optical device 100 is mounted on the stand 2020 or connected to a hanger with the screw 99 engaged with the threaded hole 91.

Tenth Embodiment

Figure 14:
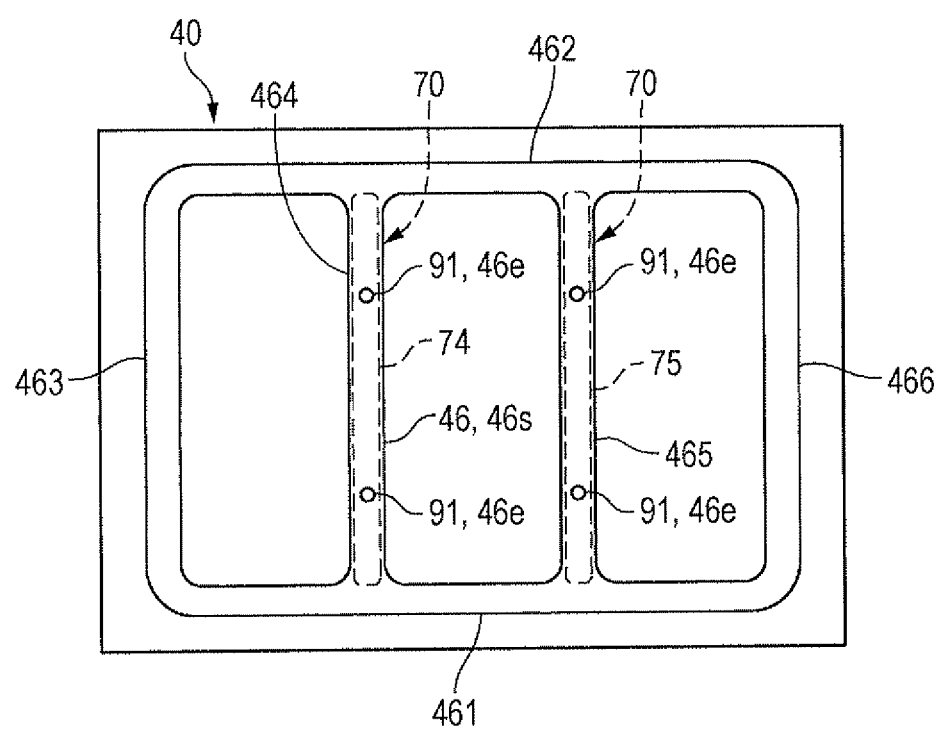
FIG. 14 is a plan view of a backup plate included in an electro-optical device according to a tenth embodiment of the invention, viewed from the back face of the backup plate.

FIG. 14 illustrates the backup plate 40 included in the electro-optical device 100 according to a tenth embodiment of the invention, viewed from the side of the back face of the backup plate. The circuit boards 93, 94 are not shown in FIG. 14.

In the first to the ninth embodiments, the reinforcing member 70 is provided in the entirety of the reinforcing groove 46 (vertical grooves 463, 464, 465, 466, and horizontal grooves 461, 462) of the backup plate 40, to constitute the groove reinforcement region 47. In this embodiment, in contrast, the reinforcing member 70 is provided to constitute the groove reinforcement region 47 only in the pair of vertical grooves 464, 465 including the threaded holes 91, out of the vertical grooves 463, 464, 465, 466, and the horizontal grooves 461, 462, as shown in FIG. 14. Such a configuration also effectively prevents deflection of the backup plate 40. Therefore, deflection of the electro-optical device 100 can be effectively suppressed, even when the electro-optical device 100 is mounted on the stand 2020 or connected to a hanger with the screw 99 engaged with the threaded hole 91.

Additional Embodiments

Although the reinforcing member 70 is disconnected at the corner portions of the reinforcing groove 46, i.e., between the vertical portion 73 and the horizontal portions 71, 72, and between the vertical portion 76 and the horizontal portions 71, 72 in some of the foregoing embodiments, joint members of generally the same configuration as the metal plate 70a may be provided at those corner portions, to form a unified reinforcing member 70 as a whole.

Although the electro-optical panel 10 is exemplified by the LCD panel in the foregoing embodiments, the invention may be applied to an electro-optical device that includes an organic electroluminescence display panel.

Although the liquid crystal TV is taken up as an example of the electronic apparatus 2000 incorporated with the electro-optical device 100 in the foregoing embodiments, the electro-optical device 100 according to the invention may also be incorporated in the display panel of a personal computer, a digital signage, electronic apparatuses such as a car navigation system and a mobile communication terminal, and so forth.

The entire disclosure of Japanese Patent Application No. 2012-158356, filed Jul. 17, 2012 is expressly incorporated by reference herein.

What is claimed is:

1. An electro-optical device comprising:
an electro-optical panel;
a backup plate disposed to overlap the electro-optical panel and including a groove portion recessed in a direction opposite to the electro-optical panel; and
a groove reinforcement region including a reinforcing member, the reinforcing member being fixed to the backup plate inside the groove portion and extending along the groove portion, such that a surface of the reinforcing member on the side of the electro-optical panel is located within a depth of the groove portion,
wherein the reinforcing member includes a frontal portion covering the opening of the groove portion on the side of the electro-optical panel, and a pair of side portions respectively superimposed on inner side walls of the groove portion opposing each other, and wherein the reinforcing member is formed of a metal plate, and bent along the inner side walls in the groove reinforcement region.

2. The electro-optical device according to claim 1, wherein the backup plate includes a plurality of groove portions each of which oriented parallel to one of the sides of the electro-optical panel, and at least one of the groove portions includes the reinforcing member to form the groove reinforcement region.

3. The electro-optical device according to claim 1, wherein at least a part of the groove reinforcement region includes a wiring member extending through inside of the groove reinforcement region.

4. The electro-optical device according to claim 3, wherein the wiring member is disposed inside the reinforcing member so as to extend along the groove reinforcement region.

5. The electro-optical device according to claim 1, wherein at least a part of the frontal portion of the reinforcing member includes a recessed portion receding from the frontal portion in a depth direction of the groove portion, and a wiring member is disposed inside the recessed portion so as to extend along the groove reinforcement region.

6. The electro-optical device according to claim 1, wherein, in the groove reinforcement region, the groove portion includes a bottom portion formed on the side thereof protruding in a direction opposite to the electro-optical panel, and a member including a threaded hole open toward the bottom portion is fixed to the reinforcing member.

7. The electro-optical device according to claim 6, wherein the bottom portion includes an opening formed at a position corresponding to the threaded hole.

8. The electro-optical device according to claim 1, wherein the reinforcing member is formed of a resin member integrally with the backup plate so as to fill in the groove portion, in the groove reinforcement region.

9. The electro-optical device according to claim 8, wherein at least a part of the resin member includes a wiring member extending along the groove reinforcement region.

10. The electro-optical device according to claim 8, wherein, in the groove reinforcement region, the groove portion includes a bottom portion formed on the side thereof protruding in a direction opposite to the electro-optical panel, and the resin member includes a threaded hole open toward the bottom portion.

11. An electronic apparatus comprising the electro-optical device according to claim 1.

* * * * *